US012563886B2

United States Patent
Mei

(12) United States Patent
(10) Patent No.: US 12,563,886 B2
(45) Date of Patent: Feb. 24, 2026

(54) QUANTUM DOT LIGHT-EMITTING DEVICE, DISPLAY APPARATUS, AND MANUFACTURING METHOD

(71) Applicant: BOE Technology Group Co., Ltd., Beijing (CN)

(72) Inventor: Wenhai Mei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 429 days.

(21) Appl. No.: 18/032,503

(22) PCT Filed: Dec. 17, 2020

(86) PCT No.: PCT/CN2020/137410

§ 371 (c)(1), (2) Date: Apr. 18, 2023

(87) PCT Pub. No.: WO2022/126562

PCT Pub. Date: Jun. 23, 2022

(65) Prior Publication Data

US 2024/0324266 A1 Sep. 26, 2024

(51) Int. Cl.

*H10K 50/115* (2023.01)
*H10K 50/125* (2023.01)
(Continued)

(52) U.S. Cl.

CPC ......... *H10K 50/115* (2023.02); *H10K 50/125* (2023.02); *H10K 71/60* (2023.02); *H10K 71/841* (2023.02); *H10K 85/111* (2023.02)

(58) Field of Classification Search

CPC ........................... H10K 50/115; H10K 71/841

See application file for complete search history.

(56) References Cited

U.S. PATENT DOCUMENTS

2013/0034899 A1 2/2013 Takemura et al.
2016/0351843 A1* 12/2016 Yang .................... H10K 50/115
2017/0278894 A1 9/2017 Sato et al.

FOREIGN PATENT DOCUMENTS

CN 102911866 A 2/2013
CN 104966725 A 10/2015
(Continued)

OTHER PUBLICATIONS

PCT/CN2020/137410 international search report, Aug. 31, 2021.
CN 202080003401.6 first office action dated Mar. 24, 2025.

*Primary Examiner* — Daniel P Shook
(74) *Attorney, Agent, or Firm* — IPro, PLLC

(57) ABSTRACT

A quantum dot light-emitting device, a display apparatus, and a manufacturing method are provided. The quantum dot light-emitting device includes a base substrate and a plurality of sub-pixels having different light-emitting colors located on one side of the base substrate. Each sub-pixel includes a first electrode; a quantum dot light-emitting portion, the quantum dot light-emitting portion being located on the side of the first electrode facing away from the base substrate; an electrical response portion, the electrical response portion being located between the first electrode and the quantum dot light-emitting portion and having a conjugated polymer or a reaction product of the conjugated polymer; and a second electrode, the second electrode being located on the side of the quantum dot light-emitting portion facing away from the electrical response portion.

20 Claims, 11 Drawing Sheets

(51) Int. Cl.

| | |
|---|---|
| ***H10K 71/00*** | (2023.01) |
| ***H10K 71/60*** | (2023.01) |
| ***H10K 85/10*** | (2023.01) |

(56) References Cited

FOREIGN PATENT DOCUMENTS

| | | | |
|---|---|---|---|
| CN | 108695437 | A | 10/2018 |
| CN | 109119444 | A | 1/2019 |
| CN | 110289362 | A | 9/2019 |
| CN | 111244305 | A | 6/2020 |
| WO | 2009091257 | A1 | 7/2009 |
| WO | 2016051992 | A1 | 4/2016 |

* cited by examiner

QUANTUM DOT LIGHT-EMITTING DEVICE, DISPLAY APPARATUS, AND MANUFACTURING METHOD

This application is a National Stage of International Application No. PCT/CN2020/137410, filed on Dec. 17, 2020, which is hereby incorporated by reference in its entirety.

FIELD

The present disclosure relates to the technical field of semiconductors, and particularly to a quantum dot light-emitting device, a display apparatus, and a manufacturing method.

BACKGROUND

With further development of a quantum dot technology, the research of electroluminescent quantum dot light-emitting diodes is deepened day by day, the quantum efficiency is constantly improved, and has basically reached the level of industrialization, and it has become the future trend to further adopt new processes and technologies to realize industrialization of the diodes. It has become an important issue to apply quantum dots to perform patterning to prepare high-resolution electroluminescent quantum dot light-emitting diodes.

SUMMARY

An embodiment of the present disclosure provides a quantum dot light-emitting device, including a base substrate and a plurality of sub-pixels located on a side of the base substrate and having different light-emitting colors, where each of the sub-pixels includes:

- a first electrode:
- a quantum dot light-emitting portion, where the quantum dot light-emitting portion is located on a side of the first electrode facing away from the base substrate:
- an electrical response portion, where the electrical response portion is located between the first electrode and the quantum dot light-emitting portion and includes a conjugated polymer or a reaction product of the conjugated polymer, the electrical response portion is configured to have different surface contact properties by adjusting a voltage of the first electrode when forming the quantum dot light-emitting portion, and the surface contact property is hydrophilic or hydrophobic; and
- a second electrode, wherein the second electrode is located on a side of the quantum dot light-emitting portion facing away from the electrical response portion.

In a possible implementation, electrical response portions of part of the sub-pixels include conjugated polymers, and electrical response portions of part of the sub-pixels include oxidation products after the conjugated polymers undergo an oxidation reaction.

In a possible implementation, the conjugated polymer is one of:

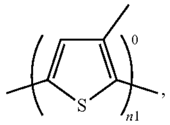, where n1>1; or

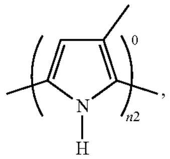, where n2>1.

In a possible implementation, the oxidation product is one of:

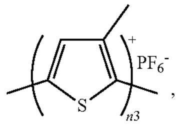, where n3>1;

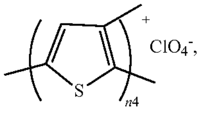, where n4>1;

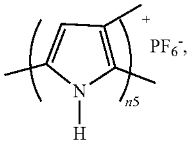, where n5>1; or

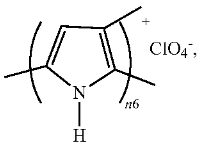, where n6>1.

In a possible implementation, the electrical response portion is of a porous structure.

In a possible implementation, quantum dot light-emitting portions of all the sub-pixels have a same surface contact property.

In a possible implementation, quantum dot ends of the quantum dot light-emitting portions are connected with one of or a combination of:

oxhydryl: or carboxyl.

In a possible implementation, quantum dot ends of the quantum dot light-emitting portions are connected with one of or a combination of:

alkyl: or aryl.

In a possible implementation, the quantum dot light-emitting portion is in direct contact with the electrical response portion.

In a possible implementation, a front film layer is arranged between the first electrode and the electrical response portion.

In a possible implementation, the front film layer is an electron transport layer: or the front film layer includes a hole injection layer and a hole transport layer arranged in a stacked mode, and the hole transport layer is located on a side of the hole injection layer facing away from the first electrode.

An embodiment of the present disclosure further provides a display apparatus, including the quantum dot light-emitting device provided by an embodiment of the present disclosure.

An embodiment of the present disclosure further provides a manufacturing method for a quantum dot light-emitting device, including:

forming first electrodes of sub-pixels on a side of a base substrate:

forming electrical response portions including conjugated polymers for initial states of the sub-pixels; and sequentially forming quantum dot light-emitting portions of the sub-pixels having different light-emitting colors, where a current sub-pixel with a quantum dot light-emitting portion to be formed is taken as a target sub-pixel, and the sequentially forming the quantum dot light-emitting portions of the sub-pixels having the different light-emitting colors includes: forming the quantum dot light-emitting portion of the target sub-pixel: where the forming the quantum dot light-emitting portion of the target sub-pixel includes:

adjusting surface contact properties of the electrical response portions and/or the quantum dot light-emitting portions, to enable a surface contact property of an exposed surface of the target sub-pixel to be different from surface contact properties of exposed surfaces of the other sub-pixels, where the surface contact property is hydrophilic or hydrophobic; and forming a quantum dot light-emitting portion with a same surface contact property as the surface contact property of the exposed surface of the target sub-pixel.

In a possible implementation, the target sub-pixel is a first sub-pixel with a quantum dot light-emitting portion to be formed for a first time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels includes:

loading a first voltage to a first electrode of the first sub-pixel, to enable a conjugated polymer of the first sub-pixel to undergo an oxidation reaction in a state of a solution including a reactant.

In a possible implementation, the target sub-pixel is a second sub-pixel with a quantum dot light-emitting portion to be formed for a second time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels includes:

loading a second voltage to a sub-pixel other than the first sub-pixel and the second sub-pixel, to enable a conjugated polymer of the sub-pixel other than the first sub-pixel and the second sub-pixel to undergo an oxidation reaction in a state of a solution including a reactant.

In a possible implementation, the target sub-pixel is a third sub-pixel with a quantum dot light-emitting portion to be formed for a third time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels includes:

loading a third voltage to a first electrode of the third sub-pixel, to enable a reaction product of a conjugated polymer of the third sub-pixel to undergo a reduction reaction in a state of a solution including a reactant; and performing ligand exchange, to enable a surface contact property of a quantum dot film of the second sub-pixel to be converted to be same as a surface contact property of a quantum dot film of the first sub-pixel.

In a possible implementation, the target sub-pixel is a third sub-pixel with a quantum dot light-emitting portion to be formed for a third time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels includes:

performing ligand exchange, to enable a surface contact property of a quantum dot film of the first sub-pixel to be converted to be same as a surface contact property of a quantum dot film of the second sub-pixel.

In a possible implementation, after forming the quantum dot light-emitting portion with the same surface contact property as the surface contact property of the exposed surface of the target sub-pixel, the manufacturing method further includes:

performing ligand exchange, to enable the quantum dot light-emitting portions of all the sub-pixels to be converted to have the same surface contact property.

In a possible implementation, the forming the electrical response portions including the conjugated polymers for the initial states of the sub-pixels includes:

forming the electrical response portions including the conjugated polymers for the initial states of the sub-pixels through electro-deposition.

DETAILED DESCRIPTION OF EMBODIMENTS

To make objectives, technical solutions and advantages of embodiments of the present disclosure clearer, the technical solutions of embodiments of the present disclosure will be clearly and completely described below in conjunction with the accompanying drawings of embodiments of the present disclosure. Apparently, the described embodiments are a part of embodiments of the present disclosure, not all of them. Based on the described embodiments of the present disclosure, all other embodiments obtained by those ordinarily skilled in the art without involving creative labor fall within the scope of protection of the present disclosure.

Unless otherwise defined, technical or scientific terms used herein shall have the ordinary meanings understood by those ordinarily skilled in the art to which the present disclosure pertains. “First”, “second” and similar words used in the present disclosure do not show any order, quantity or importance, and are merely used to distinguish different components. “Comprise”, “include” or similar words indicate that an element or item appearing before such words covers listed elements or items appearing after the words and equivalents thereof, and does not exclude other elements or items. “Connect”, “link” or similar words are not limited to physical or mechanical connection, but may include electrical connection, no matter direct or indirect. “Upper”, “lower”, “left”, “right”, etc. are merely used to show a relative position relation, and when an absolute position of a described object is changed, the relative position relation may also be correspondingly changed.

In order to keep following descriptions of embodiments of the present disclosure clear and concise, the present disclosure omits detailed descriptions of known functions and known parts.

Figure 1:
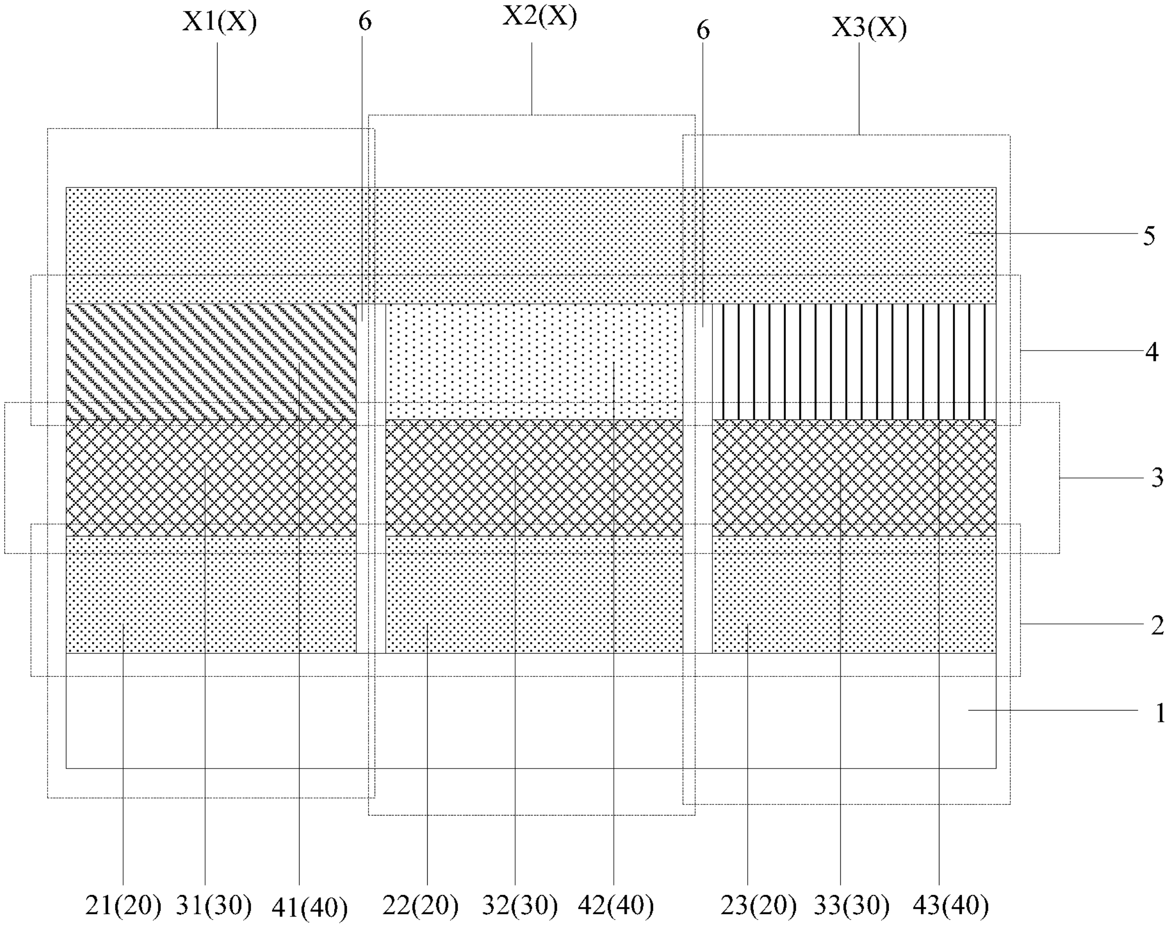
FIG. 1 is a first schematic structural diagram of a quantum dot light-emitting device provided by an embodiment of the present disclosure.

An embodiment of the present disclosure provides a quantum dot light-emitting device, as shown in FIG. 1, including a base substrate 1 and a plurality of sub-pixels X having different light-emitting colors located on a side of the base substrate 1. For example, the sub-pixels X include a first sub-pixel X1 emitting light of a first color (such as red), a second sub-pixel X2 emitting light of a second color (such as green) and a third sub-pixel X3 emitting light of a third color (such as blue), a pixel defining layer 6 may be arranged between every two adjacent sub-pixels X, and each of the sub-pixels X includes:

- a first electrode 20; for example, the first sub-pixel X1 includes a first sub-electrode 21, the second sub-pixel X2 includes a second sub-electrode 22, and the third sub-pixel X3 includes a third sub-electrode 23; first electrodes 20 of different sub-pixels X form a first electrode layer 2;
- a quantum dot light-emitting portion 40, the quantum dot light-emitting portion 40 being located on a side of the first electrode 20 facing away from the base substrate 1; for example, the first sub-pixel X1 includes a first sub quantum dot light-emitting portion 41 emitting red light, the second sub-pixel X2 includes a second sub quantum dot light-emitting portion 42 emitting green light, and the third sub-pixel X3 includes a third sub quantum dot light-emitting portion 43 emitting blue light; quantum dot light-emitting portions 40 of the different sub-pixels X form a quantum dot film layer 4;

an electrical response portion 30, where the electrical response portion 30 is located between the first electrode 20 and the quantum dot light-emitting portion 40 and includes a conjugated polymer or a reaction product of the conjugated polymer, the electrical response portion 30 is configured to have different surface contact properties by adjusting a voltage of the first electrode 20 when forming the quantum dot light-emitting portion 40, and the surface contact property is hydrophilic or hydrophobic; for example, the first sub-pixel X1 includes a first electrical response portion 31, the second sub-pixel X2 includes a second electrical response portion 32, and the third sub-pixel X3 includes a third electrical response portion 33; quantum dot electrical response portions 30 of the different sub-pixels X form an electrical response film layer 3; and

- a second electrode 5, the second electrode 5 being located on a side of the quantum dot light-emitting portion 40 facing away from the electrical response portion 30, where the second electrode 5 may be a whole layer.

In an embodiment of the present disclosure, the electrical response portions are formed between the first electrodes and the quantum dot light-emitting portions, the electrical response portions include conjugated polymers or reaction products of the conjugated polymers. When forming the patterned quantum dot light-emitting portions, the conjugated polymers in the electrical response portions may be controlled to undergo, for example, an oxidation reaction, or the products after the oxidation reaction are controlled to undergo a reduction reaction, such that after different reactions, the electrical response portions may be converted between hydrophilicity and hydrophobicity. The first electrodes of the different sub-pixels are electrified, different surface contact properties of the electrical response portions in the different sub-pixels are achieved, quantum dots of ligands with different surface contact properties are designed respectively, and patterning of the quantum dot light-emitting portions with different light-emitting colors may be achieved.

Figure 2:
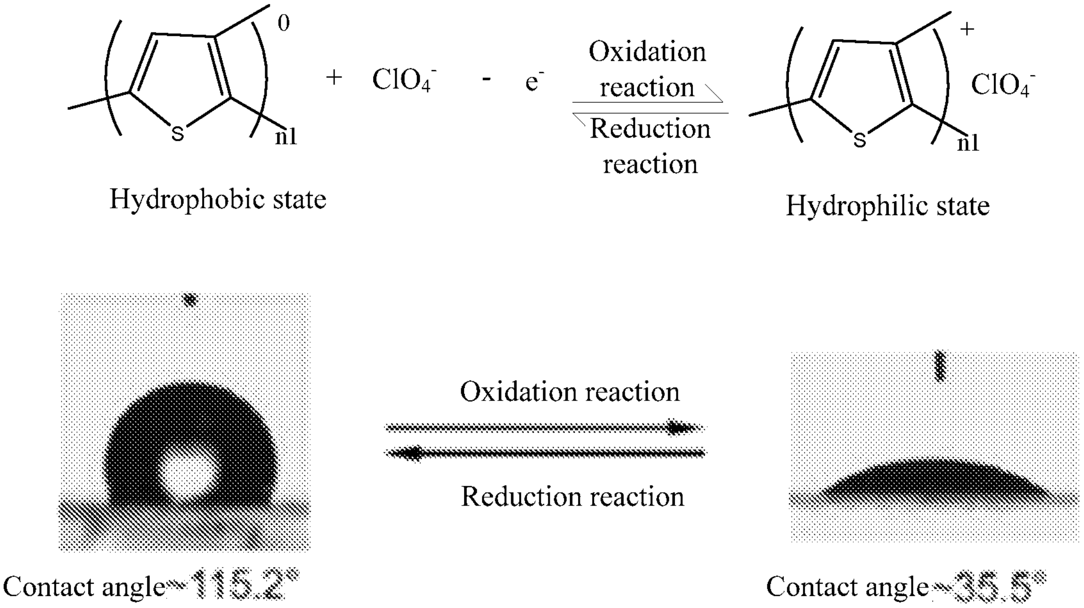
FIG. 2 is a schematic diagram of a conjugated polymer undergoing an oxidation reaction and a reduction reaction provided by an embodiment of the present disclosure.

It should be noted that the conjugated polymers (such as Π-conjugated polymers) are quite typical electrical response polymers and include polythiophene, polypyrrole, etc.; and in the case of applying different potentials to conjugated polymer films, the conjugated polymer films may undergo an oxidation reaction and a reduction reaction, show different contact angles and are converted between super-hydrophilicity and super-hydrophobicity, resulting in conversion of film wettability, as shown in FIG. 2.

In a specific implementation, the electrical response portions 30 of part of the sub-pixels X include the conjugated polymers, and the electrical response portions 30 of part of the sub-pixels include the oxidation products after the conjugated polymers undergo an oxidation reaction. For example, the second sub-pixel X2 and the third sub-pixel X3 include the conjugated polymers, and the first sub-pixel X1 includes the oxidation product after the conjugated polymer undergoes the oxidation reaction.

The conjugated polymer is one of:

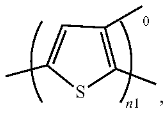
, where n1>1; or

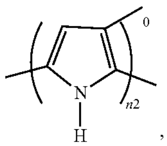
, where n2>1.

The oxidation product is one of:

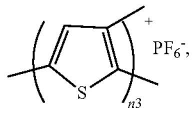
, where n3>1;

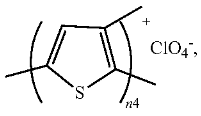
, where n4>1;

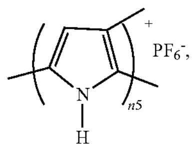
, where n5>1: or

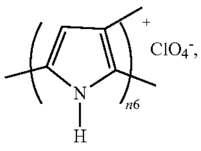
, where n6>1.

In a specific implementation, the electrical response portions 30 are of porous structures. In a specific implementation, the electrical response portions 30 may be formed through electro-deposition, and therefore the electrical response portions 30 may be of the porous structures. In an embodiment of the present disclosure, the electrical response portions 30 are of the porous structures, which may increase a specific surface area of the electrical response portions 30, improve a contact area between the electrical response portions and other matter and magnify the hydrophilic or hydrophobic effect.

In a specific implementation, the quantum dot light-emitting portions of all the sub-pixels have a same surface contact property. In a specific implementation, the surface contact properties of all the sub-pixels X are the same through ligand exchange. The surface contact properties of all the sub-pixels X may be all hydrophilic, and the surface contact properties of all the sub-pixels X may also be all hydrophobic. In an embodiment of the present disclosure, the quantum dot light-emitting portions of all the sub-pixels have the same surface contact property, which is beneficial to formation of a uniform subsequent film layer, and avoids that if surfaces of the quantum dot light-emitting portions 40 of part of the sub-pixels X are hydrophilic, while surfaces of the quantum dot light-emitting portions 40 of part of the sub-pixels X are hydrophobic, consequently, during formation of the subsequent film layer, the surface contact properties of the quantum dot light-emitting portions are different from a contact property of the subsequent film layer in different regions, resulting in poor uniformity of the formed subsequent film layer.

Quantum dot ends of the quantum dot light-emitting portions 40 are connected with one of or a combination of: oxhydryl: or carboxyl.

In an embodiment of the present disclosure, the quantum dot ends of the quantum dot light-emitting portions 40 are connected with the oxhydryl and/or carboxyl, which enables the quantum dot light-emitting portions 40 of all the sub-pixels X to be all hydrophilic.

The quantum dot ends of the quantum dot light-emitting portions are connected with one of or a combination of: alkyl: or aryl.

In an embodiment of the present disclosure, quantum dot ends of the quantum dot light-emitting portions 40 are connected with the alkyl and/or aryl, which enables the quantum dot light-emitting portions 40 of all the sub-pixels X to be all hydrophobic.

In a specific implementation, as shown in combination with FIG. 1, the quantum dot light-emitting portions 40 are in direct contact with the electrical response portions 30.

Figure 3:
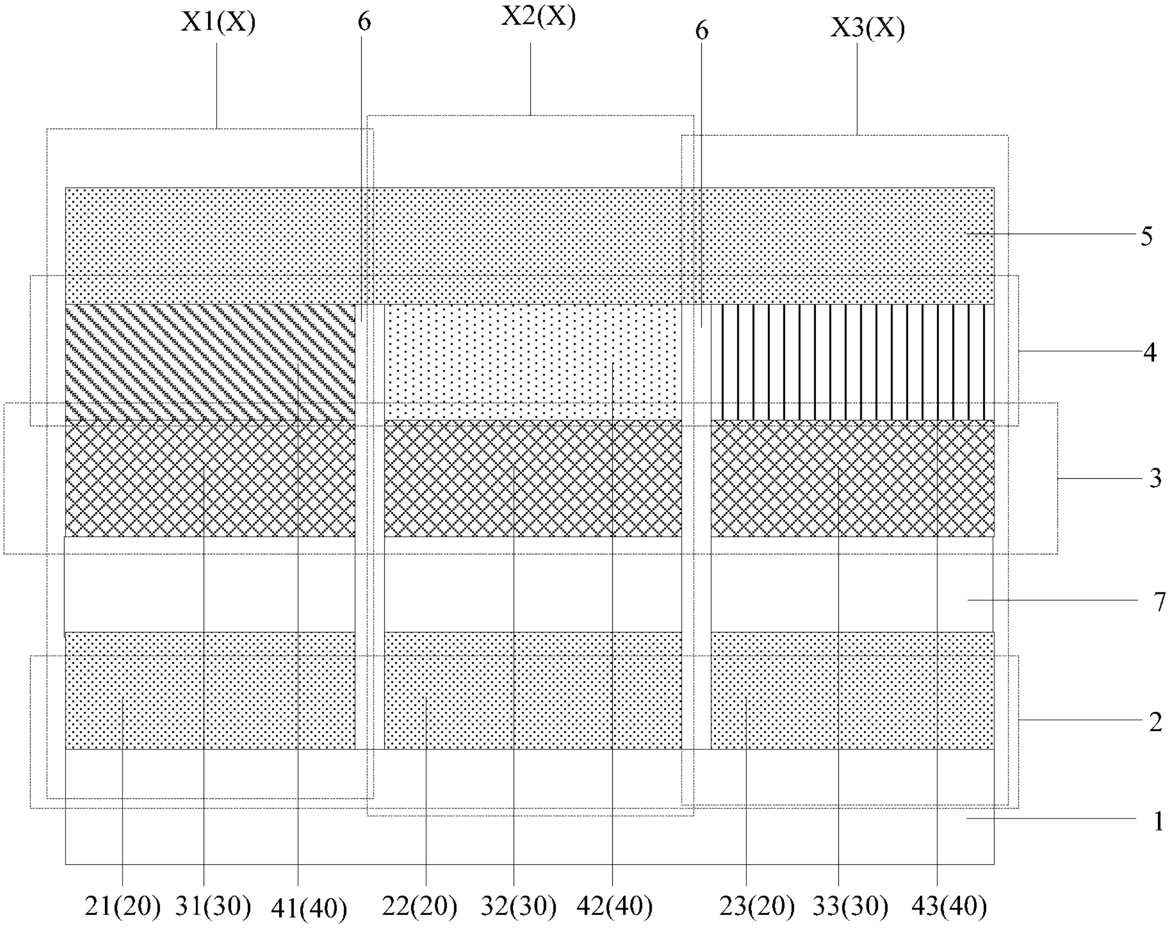
FIG. 3 is a second schematic structural diagram of a quantum dot light-emitting device provided by an embodiment of the present disclosure.

In a specific implementation, as shown in FIG. 3, front film layers 7 are further arranged between the first electrodes 20 and the electrical response portions 30. The front film layers 7 are electron transport layers: or each front film layer 7 includes a hole injection layer and a hole transport layer arranged in a stacked mode, and the hole transport layer is located on a side of the hole injection layer facing away from the first electrode 20.

Figure 4:
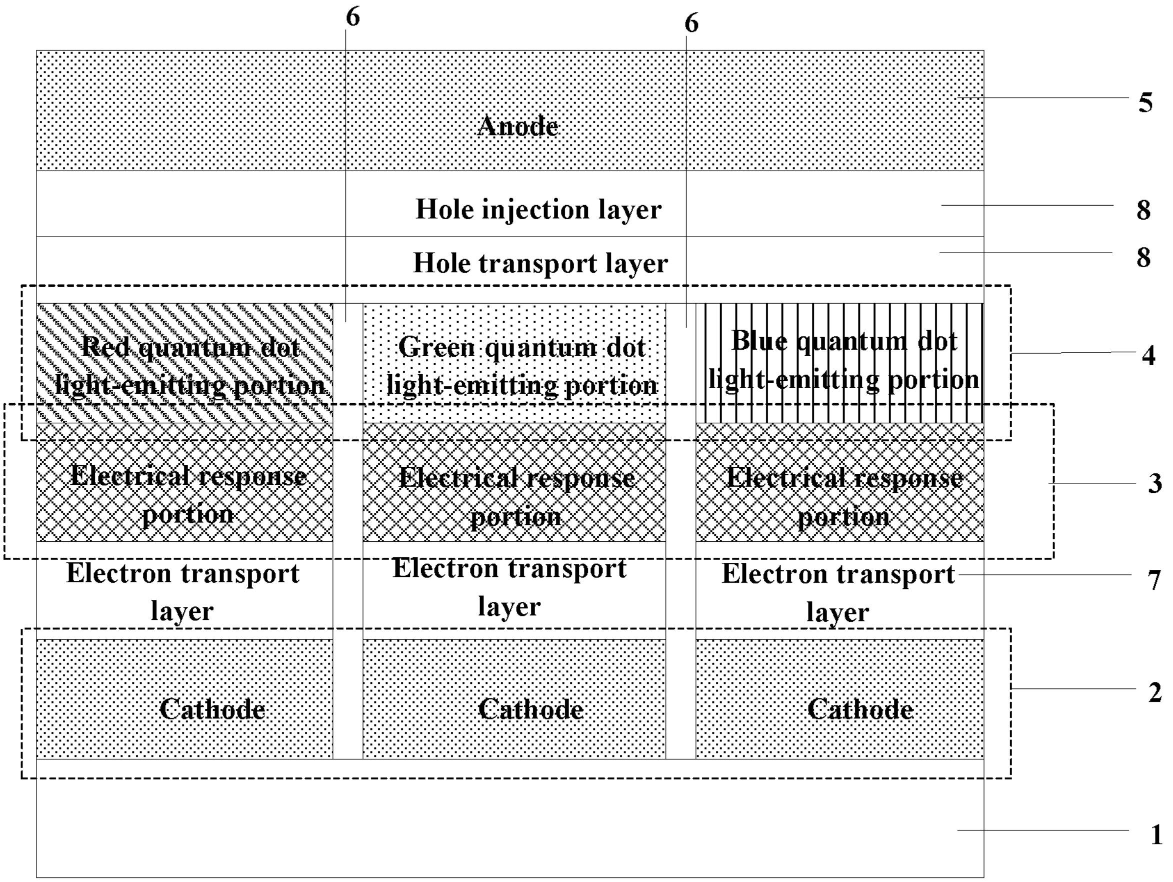
FIG. 4 is a third schematic structural diagram of a quantum dot light-emitting device provided by an embodiment of the present disclosure.

The quantum dot light-emitting device provided by an embodiment of the present disclosure may be an inverted quantum dot light-emitting device, as shown in FIG. 4, the first electrode layer 2 is a cathode layer, and the second electrode layer 5 is an anode layer. The cathode layer (the first electrode layer 2), the electron transport layers (the front film layers 7), an electrical response film layer 3, a quantum dot film layer 4, a hole transport layer, a hole injection layer (functional layers of the hole transport layer and hole injection layer may be used as functional layers 8), and an anode (the second electrode layer 5) are successively arranged on a side of the base substrate 1.

Figure 5:
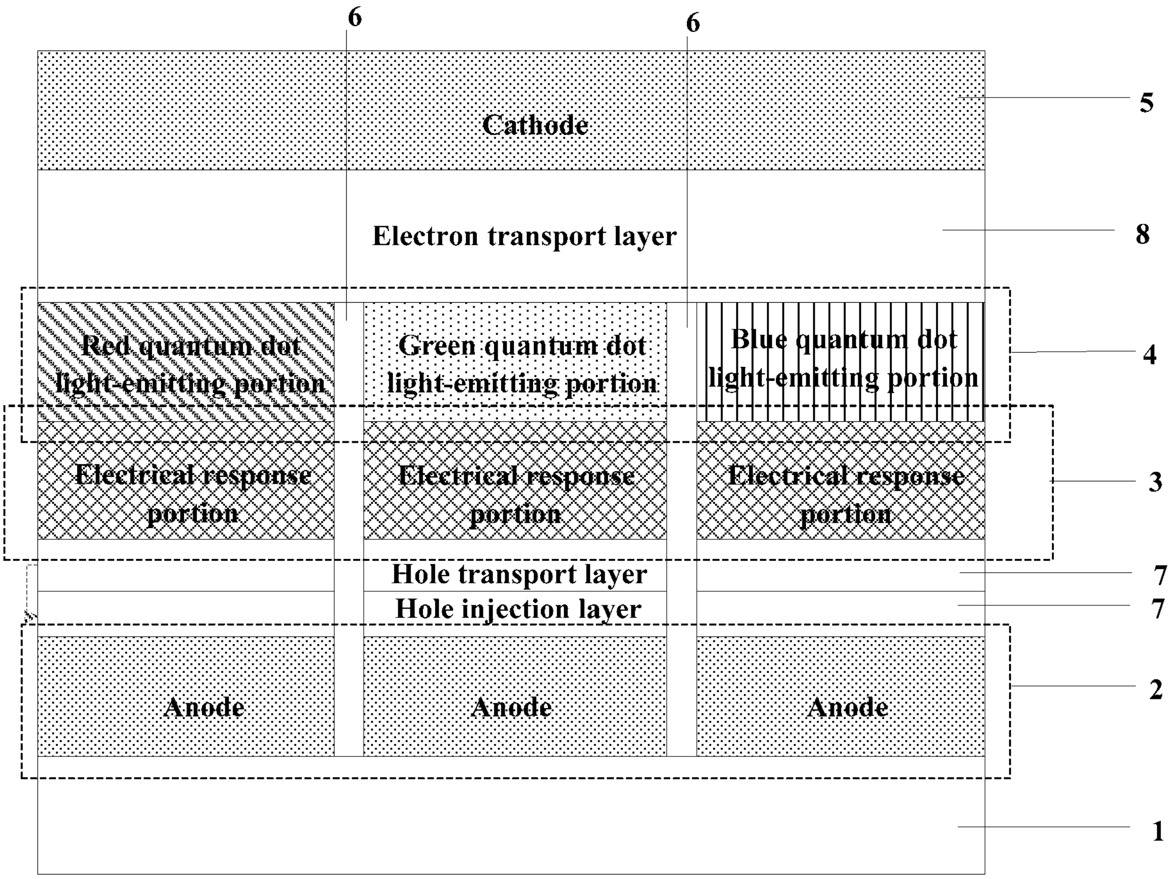
FIG. 5 is a fourth schematic structural diagram of a quantum dot light-emitting device provided by an embodiment of the present disclosure.

The quantum dot light-emitting device provided by an embodiment of the present disclosure may be an upright quantum dot light-emitting device, as shown in FIG. 5, the first electrode layer 2 is the anode layer, and the second electrode layer 5 is the cathode layer. The anode layer (the first electrode layer 2), a hole transport layer, a hole injection layer (functional layers of the hole transport layer and hole injection layer may be used as the front film layers 7), the electrical response film layer 3, the quantum dot film layer 4, an electron transport layer (the electron transport layer may be used as a functional layer 8) and a cathode (the second electrode layer 5) are successively arranged on a side of the base substrate 1.

Based on the same inventive concept, an embodiment of the present disclosure further provides a display apparatus, including the quantum dot light-emitting device provided by an embodiment of the present disclosure. The display apparatus may be a mobile phone, a tablet personnel computer, a television, a display, a notebook computer, a digital photo frame, a navigator, an intelligent watch, a fitness bracelet, a personnel digital assistant and any product or component with a display function. Other essential components of the display apparatus should be understood by those ordinarily skilled in the art, which are not repeated here, and also should not be taken as a limitation to the present disclosure. In addition, since a principle of solving problems by the display apparatus is similar to a principle of solving problems by an above quantum dot light-emitting device, implementation of the display apparatus may refer to an embodiment of the above quantum dot light-emitting device, and repetitions will not be repeated.

Figure 6:
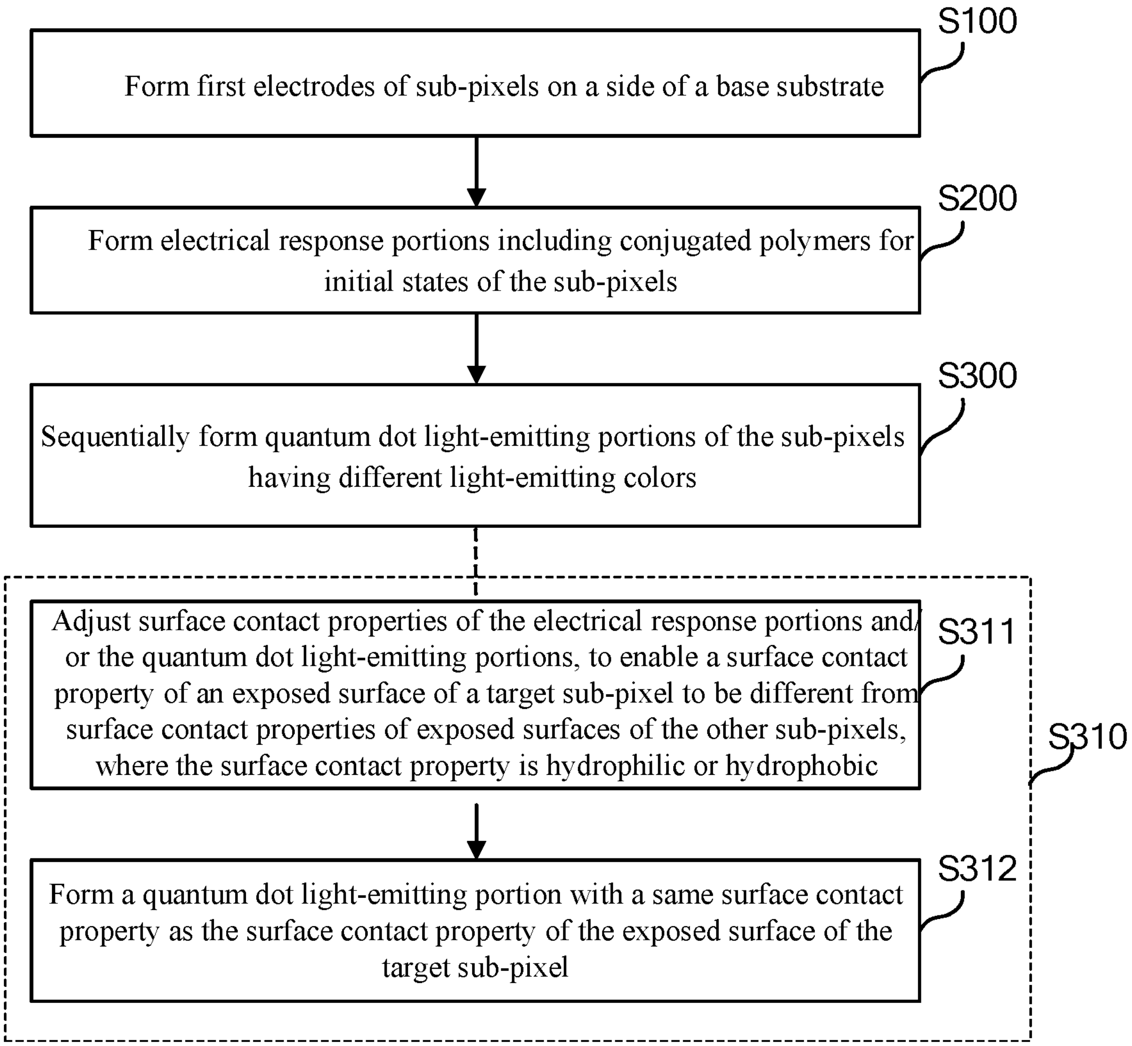
FIG. 6 is a schematic diagram of a manufacturing flow of a quantum dot light-emitting device provided by an embodiment of the present disclosure.

Based on the same inventive concept, as shown in FIG. 6, an embodiment of the present disclosure further provides a manufacturing method for a quantum dot light-emitting device, including following steps.

Step S100: first electrodes of sub-pixels are formed on a side of a base substrate.

Step S200: electrical response portions including conjugated polymers for initial states of the sub-pixels are formed, where the initial states may be understood as states before a voltage is loaded to the first electrodes to change surface contact properties of the conjugated polymers. A polymer layer is conjugated through electro-deposition, and a conjugated polymer layer formed through electro-deposition enables the electrical response portion to have a porous structure.

Step S300, quantum dot light-emitting portions of the sub-pixels having different light-emitting colors are sequentially formed, where a current sub-pixel with a quantum dot light-emitting portion to be formed is taken as a target sub-pixel, and the sequentially forming the quantum dot light-emitting portions of the sub-pixels having the different light-emitting colors includes: step S310, the quantum dot light-emitting portion of the target sub-pixel is formed. The forming the quantum dot light-emitting portion of the target sub-pixel in step 310 includes following steps.

Step S311, surface contact properties of the electrical response portions and/or the quantum dot light-emitting portions are adjusted, to enable a surface contact property of an exposed surface of the target sub-pixel to be different from surface contact properties of exposed surfaces of the other sub-pixels, where the surface contact property is hydrophilic or hydrophobic.

Step S312, a quantum dot light-emitting portion with a same surface contact property as the surface contact property of the exposed surface of the target sub-pixel is formed.

In a specific implementation, the target sub-pixel is a first sub-pixel with a quantum dot light-emitting portion to be formed for a first time. For example, when the target sub-pixel is a red sub-pixel, the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels, where the surface contact property is hydrophilic or hydrophobic in step S311, includes: a first voltage is loaded to a first electrode of the first sub-pixel, to enable a conjugated polymer of the first sub-pixel to undergo an oxidation reaction in a state of a solution including a reactant.

In a specific implementation, the target sub-pixel is a second sub-pixel with a quantum dot light-emitting portion to be formed for a second time. For example, when the target sub-pixel is a green sub-pixel, the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels, where the surface contact property is hydrophilic or hydrophobic in step S311, includes: a second voltage is loaded to a sub-pixel other than the first sub-pixel and the second sub-pixel, to enable a conjugated polymer of the sub-pixel other than the first sub-pixel and the second sub-pixel to undergo an oxidation reaction in a state of a solution including a reactant.

In a specific implementation, the target sub-pixel is a third sub-pixel with a quantum dot light-emitting portion to be formed for a third time. For example, when the target sub-pixel is a blue sub-pixel, the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels, where the surface contact property is hydrophilic or hydrophobic in step S311, includes: a third voltage is loaded to a first electrode of the third sub-pixel, to enable a reaction product of a conjugated polymer of the third sub-pixel to undergo a reduction reaction in a state of a solution including a reactant; and ligand exchange is performed, to enable a surface contact property of a quantum dot film of the second sub-pixel to be converted to be same as a surface contact property of a quantum dot film of the first sub-pixel.

In a specific implementation, the target sub-pixel is the third sub-pixel with the quantum dot light-emitting portion to be formed for the third time. For example, when the target sub-pixel is the blue sub-pixel, the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels, where the surface contact property is hydrophilic or hydrophobic in step S311, includes: ligand exchange is performed, to enable the surface contact property of the quantum dot film of the first sub-pixel to be converted to be the same as the surface contact property of the quantum dot film of the second sub-pixel.

In a specific implementation, after forming the quantum dot light-emitting portion with the same surface contact property as the surface contact property of the exposed surface of the target sub-pixel, the manufacturing method further includes a following step.

Step S313, ligand exchange is performed, to enable the quantum dot light-emitting portions of all the sub-pixels to be converted to have the same surface contact property.

To more clearly understand the manufacturing method for the quantum dot light-emitting device provided by an embodiment of the present disclosure, it is further illustrated as follows.

In a possible implementation, as shown in FIG. 7, FIG. 8, FIG. 9 and FIG. 11, the manufacturing method for the quantum dot light-emitting device includes following steps.

In a first step, first electrodes (such as cathodes) of sub-pixels and front film layers 7 (such as electron transport layers) are formed on a side of a base substrate 1. The base substrate 1 may be a flexible base substrate, such as a plastic substrate with excellent heat resistance and durability made of polyethylene ether phthalate, polyarylate, polyimide (PI), polyethylene terephthalate (PET), polycarbonate (PC), cycloolefin polymer (COP), cellulose acetate propionate (CAP), polyethersulfone (PES), polyacrylate (PAR), polyetherimide (PEI), polyethylene naphthalate (PEN), polyphenylene sulfide (PPS), polyallyl ester, cellulose triacetate (TAC) or the like; and the base substrate may also be a rigid base substrate, such as a glass substrate, which is not limited here.

In a second step, electrical response portions with a same surface contact property of the sub-pixels are formed, where the electrical response portions have conjugated polymers. For example, electro-deposition may be performed in an acetonitrile solution of 3-methyl polythiophene (used as the conjugated polymers), and the deposition amount is 30 mC cm-2. For example, the electrical response portions having hydrophobicity of the sub-pixels may be formed, as shown in an accompanying drawing at an upper side in FIG. 7.

Figure 7:
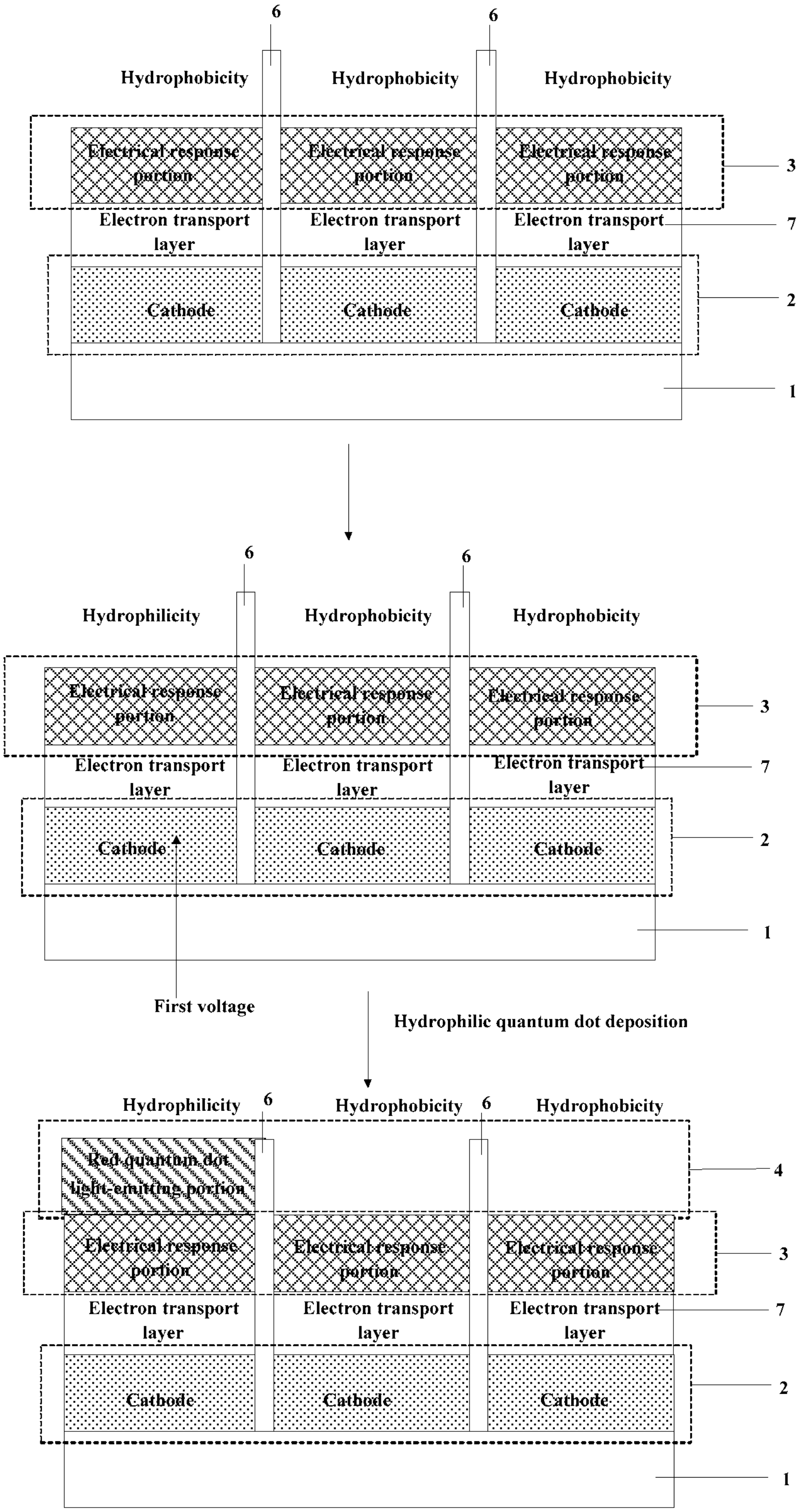
FIG. 7 is a schematic diagram of formation of a first quantum dot light-emitting portion provided by an embodiment of the present disclosure.

In a third step, a target sub-pixel is a red sub-pixel with a quantum dot light-emitting portion to be formed for the first time, and a first voltage (such as, −0.4 V) is loaded to the first electrode (such as, the cathode) of the red sub-pixel in a state of a solution including a reactant, as shown in a middle accompanying drawing in FIG. 7. The base substrate formed with the electrical response portions may be placed in a dimethylformamide (DMF) solution including tetrabutylammonium hexafluorophosphate (used as the reactant), a −0.4 V potential is applied to the cathode of the red sub-pixel with a red quantum dot required to be deposited, such that an oxidation reaction of the conjugated polymer of the red sub-pixel may be shown as follows:

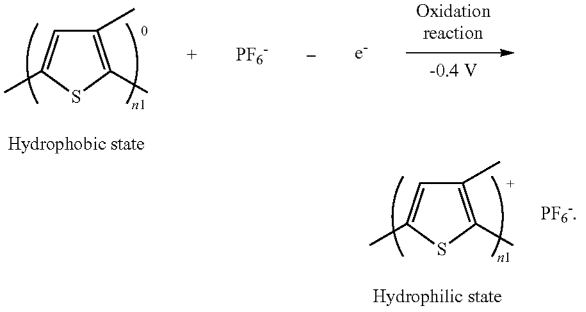

Then, the electrical response portion of the red sub-pixel is converted to be hydrophilic, and after applying the potential, the substrate is taken out, blown to be dry and then annealed for 10 minutes at 150° C.

In a fourth step, a red quantum dot film with a same surface contact property as the surface contact property of the electrical response portion in the red sub-pixel is formed, that is, a hydrophilic red quantum dot light-emitting portion is formed, as shown in an accompanying drawing at a lower side in FIG. 7. Hydrophilic red quantum dots (10 mg/ml) may be spin-coated, after spin coating, hexyl alcohol is used for flushing the base substrate, quantum dots with weak adhesion to other pixels are washed away, and the patterned red light quantum dot film layer is formed.

In a fifth step, a target sub-pixel is a green sub-pixel with a quantum dot light-emitting portion to be formed for the second time. A second voltage is loaded to a sub-pixel (that is, a blue sub-pixel, in FIG. 7 to FIG. 11, in each light-emitting device, distribution of sub-pixels from left to right is: the red sub-pixel, the green sub-pixel and the blue sub-pixel) other than the red sub-pixel and the green sub-pixel in a state of a solution including a reactant, such that a conjugated polymer of the sub-pixel (that is, the blue sub-pixel) other than the red sub-pixel and the green sub-pixel undergoes an oxidation reaction, such that the electrical response portion in a region where the blue sub-pixel is located is converted to be hydrophilic. Since the hydrophilic red quantum dot light-emitting portion has been formed in the red sub-pixel in the fourth step, only the electrical response portion in a region where the green sub-pixel is located is hydrophobic finally, as shown in an accompanying drawing at an upper side in FIG. 8. The base substrate formed with the red quantum dot light-emitting portion may be placed in a DMF solution including tetrabutylammonium hexafluorophosphate (used as the reactant), a −0.4 V potential is applied to a cathode of the blue sub-pixel, and an oxidation reaction of the conjugated polymer of the blue sub-pixel may be shown as follows:

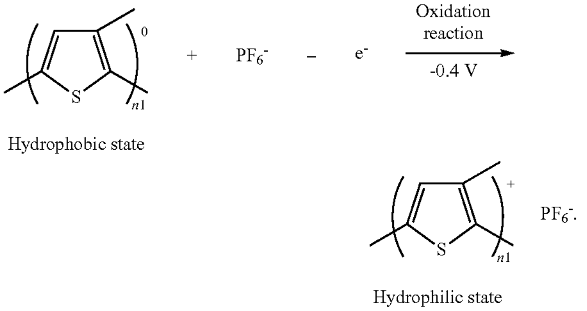

Then, the electrical response portion of the blue sub-pixel is converted to be hydrophilic, and after applying the potential, the substrate is taken out, blown to be dry and then annealed for 10 minutes at 150° C.

Figure 8:
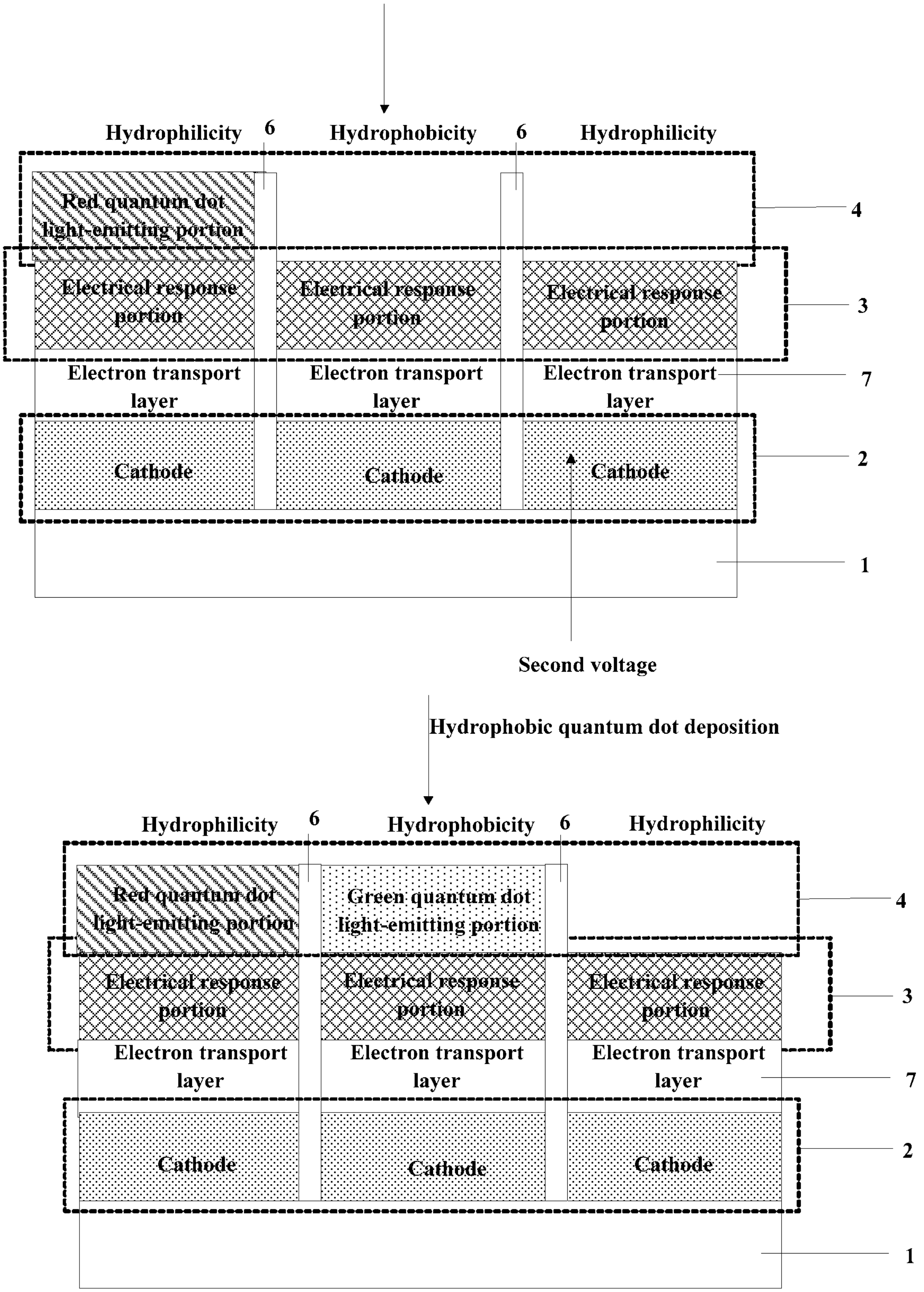
FIG. 8 is a schematic diagram of formation of a second quantum dot light-emitting portion provided by an embodiment of the present disclosure.

In a sixth step, a green quantum dot film with a same surface contact property as the surface contact property of the electrical response portion in the green sub-pixel is formed, that is, a hydrophobic green quantum dot light-emitting portion is formed, as shown in an accompanying drawing at a lower side in FIG. 8. Hydrophobic green quantum dots may be spin-coated, after spin coating, hexyl alcohol is used for flushing the base substrate, quantum dots with weak adhesion to other pixels are washed away, and the patterned green light quantum dot film layer is formed.

Figure 9:
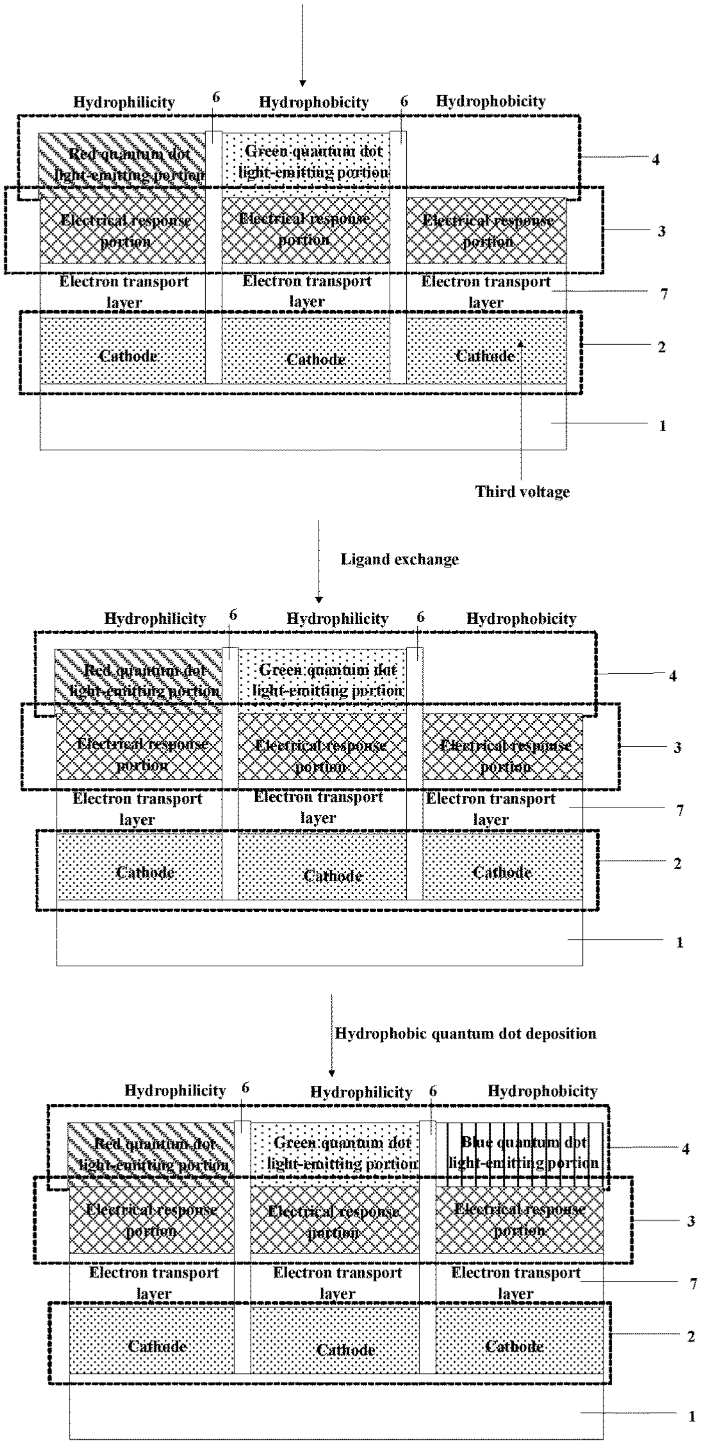
FIG. 9 is a schematic diagram of formation of a third quantum dot light-emitting portion provided by an embodiment of the present disclosure.

In a seventh step, a target sub-pixel is a blue sub-pixel with a quantum dot light-emitting portion to be formed for the third time, a third voltage is loaded to a cathode of the blue sub-pixel in a state of a solution including a reactant, such that an oxidation product obtained after the conjugated polymer of the blue sub-pixel undergoes an oxidation reaction undergoes a reduction reaction, and then the electrical response portion of the blue sub-pixel is converted to be hydrophobic again, as shown in an accompanying drawing at an upper side in FIG. 9. A 0.6 V potential may be applied to the cathode of the blue sub-pixel, and the reduction reaction of the blue sub-pixel may be shown as follows:

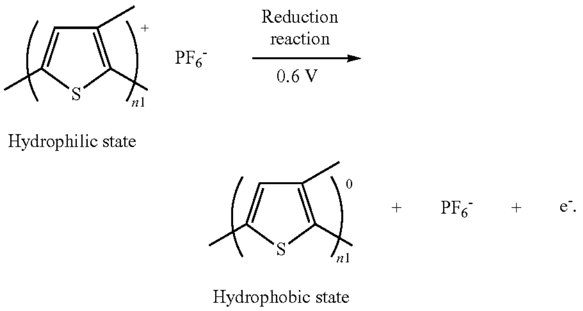

Then, the electrical response portion of the blue sub-pixel is converted to be hydrophobic, and after applying the potential, the substrate is taken out, blown to be dry and then annealed for 10 minutes at 150° C.

In an eighth step, ligand exchange is performed, such that the surface contact property of the quantum dot light-emitting portion of the green sub-pixel is converted to be the same as the surface contact property of the quantum dot film of the red sub-pixel, and finally, only the electrical response portion of the blue sub-pixel is hydrophobic, as shown in the accompanying drawing in a middle in FIG. 9.

In a ninth step, a blue quantum dot film with a same surface contact property as the surface contact property of the electrical response portion in the blue sub-pixel is formed, that is, the hydrophobic blue quantum dot light-emitting portion is formed, as shown in the accompanying drawing at a lower side in FIG. 9. Hydrophobic blue light quantum dots may be spin-coated, after spin coating, hexyl alcohol is used for flushing the base substrate, quantum dots with weak adhesion to other pixels are washed away, and the patterned blue light quantum dot film layer is formed.

Figure 11:
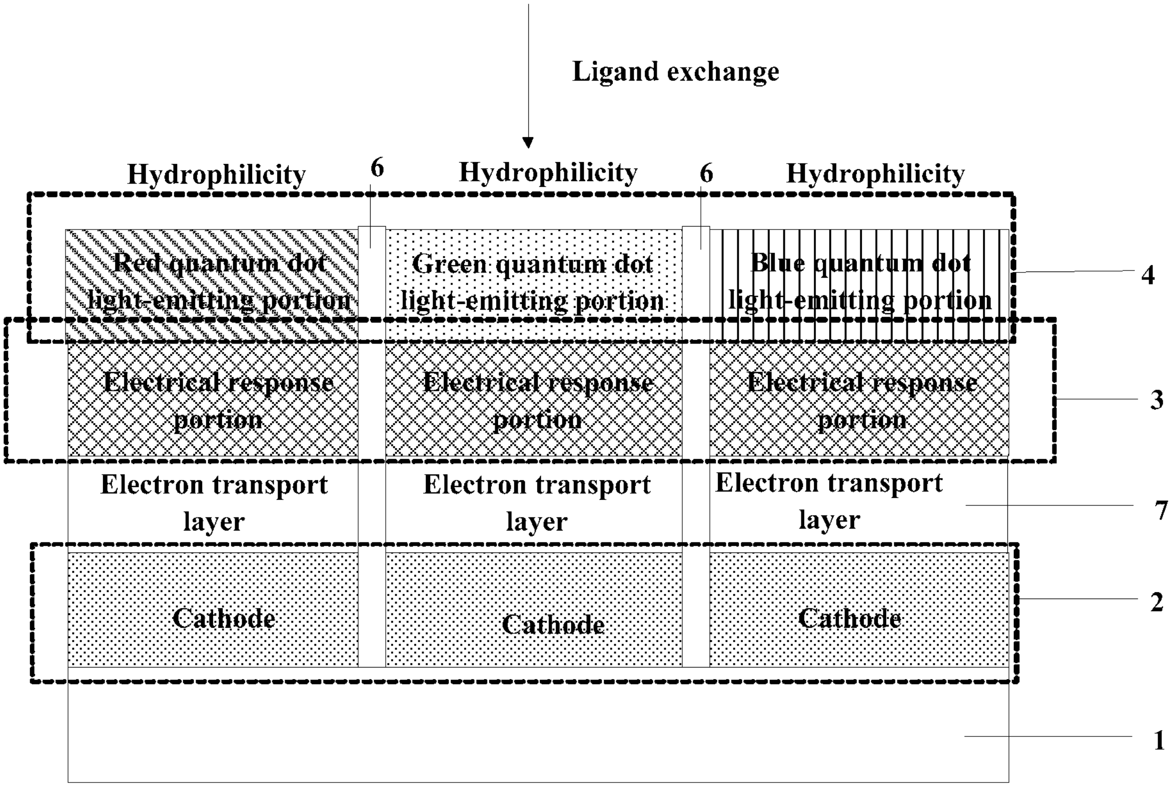
FIG. 11 is a schematic diagram of converting all quantum dot light-emitting portions into hydrophilic surfaces provided by an embodiment of the present disclosure.

In a tenth step, ligand exchange is performed, such that the blue quantum dot light-emitting portion of the blue sub-pixel is converted to be a hydrophilic surface, and finally, the quantum dot light-emitting portions of all the sub-pixels are converted to have the same surface contact property; as shown in FIG. 11.

In the other possible implementation, as shown in FIG. 7, FIG. 8, FIG. 10 and FIG. 11, the manufacturing method for the quantum dot light-emitting device includes following steps.

In a first step, first electrodes (such as cathodes) of sub-pixels and front film layers 7 (such as electron transport layers) are formed on a side of a base substrate 1. The base substrate 1 may be a flexible base substrate, such as a plastic substrate with excellent heat resistance and durability made of polyethylene ether phthalate, polyarylate, polyimide (PI), polyethylene terephthalate (PET), polycarbonate (PC), cycloolefin polymer (COP), cellulose acetate propionate (CAP), polyethersulfone (PES), polyacrylate (PAR), polyetherimide (PEI), polyethylene naphthalate (PEN), polyphenylene sulfide (PPS), polyallyl ester, cellulose triacetate (TAC) or the like; and the base substrate may also be a rigid base substrate, such as a glass substrate, which is not limited here.

In a second step, electrical response portions with a same surface contact property of the sub-pixels are formed, where the electrical response portions have conjugated polymers. For example, electro-deposition may be performed in an acetonitrile solution of 3-methyl polythiophene (used as the conjugated polymers), and the deposition amount is 30 mC cm-2. For example, the electrical response portions having hydrophobicity of the sub-pixels may be formed, as shown in an accompanying drawing at an upper side in FIG. 7.

In a third step, a target sub-pixel is a red sub-pixel with a quantum dot light-emitting portion to be formed for the first time, and a first voltage (such as, −0.4 V) is loaded to the first electrode (such as, the cathode) of the red sub-pixel in a state of a solution including a reactant, as shown in a middle accompanying drawing in FIG. 7. The base substrate may be placed in a dimethylformamide (DMF) solution including tetrabutylammonium hexafluorophosphate (used as the reactant), a −0.4 V potential is applied to the cathode of the red sub-pixel with a red quantum dot required to be deposited, such that an oxidation reaction of the conjugated polymer of the red sub-pixel may be shown as follows:

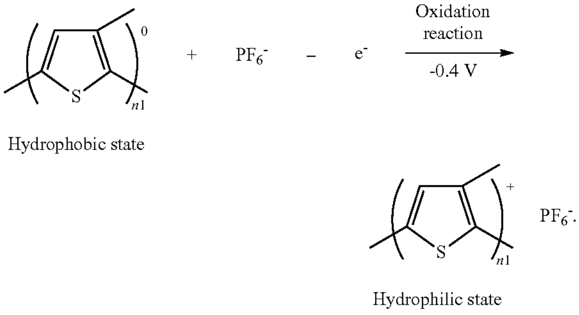

Then, the electrical response portion of the red sub-pixel is converted to be hydrophilic, and after applying the potential, the substrate is taken out, blown to be dry and then annealed for 10 minutes at 150° C.

In a fourth step, a red quantum dot film with a same surface contact property as the surface contact property of the electrical response portion in the red sub-pixel is formed, that is, a hydrophilic red quantum dot light-emitting portion is formed, as shown in an accompanying drawing at a lower side in FIG. 7.

In a fifth step, a target sub-pixel is a green sub-pixel with a quantum dot light-emitting portion to be formed for the second time. A second voltage is loaded to a sub-pixel (that is, a blue sub-pixel) other than the red sub-pixel and the green sub-pixel in a state of a solution including a reactant, such that a conjugated polymer of the sub-pixel (that is, the blue sub-pixel) other than the red sub-pixel and the green sub-pixel undergoes an oxidation reaction, such that the electrical response portion in a region where the blue sub-pixel is located is converted to be hydrophilic. Since the hydrophilic red quantum dot light-emitting portion has been formed in the red sub-pixel in the fourth step, only the electrical response portion in a region where the green sub-pixel is located is hydrophobic finally, as shown in an accompanying drawing at an upper side in FIG. 8. The substrate may be placed in a DMF solution including tetrabutylammonium hexafluorophosphate (used as the reactant), a −0.4 V potential is applied to a cathode of the blue sub-pixel, and an oxidation reaction of the conjugated polymer of the blue sub-pixel may be shown as follows:

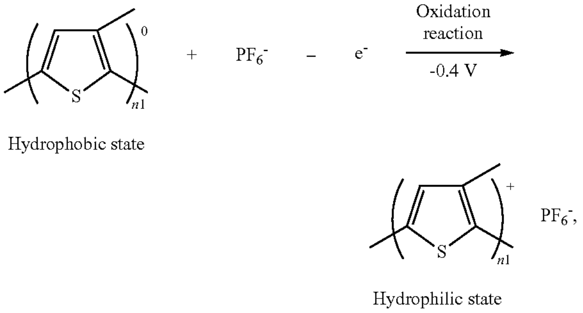

Then, the electrical response portion of the blue sub-pixel is converted to be hydrophilic, and after applying the potential, the substrate is taken out, blown to be dry and then annealed for 10 minutes at 150° C.

In a sixth step, a green quantum dot film with a same surface contact property as the surface contact property of the electrical response portion in the green sub-pixel is formed, that is, a hydrophobic green quantum dot light-emitting portion is formed, as shown in an accompanying drawing at a lower side in FIG. 8.

Figure 10:
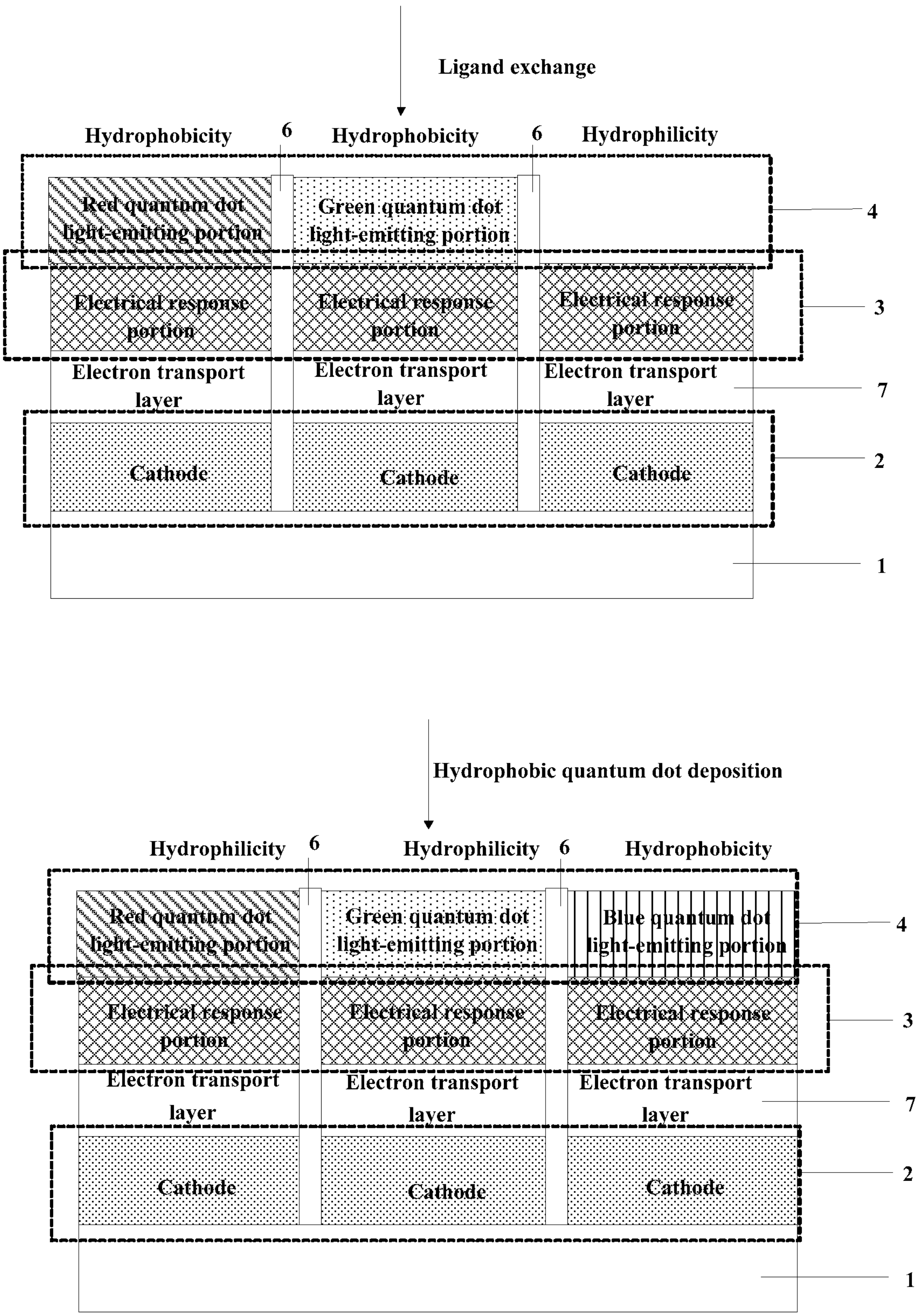
FIG. 10 is another schematic diagram of formation of a third quantum dot light-emitting portion provided by an embodiment of the present disclosure.

In a seventh step, a target sub-pixel is a blue sub-pixel with a quantum dot light-emitting portion to be formed for the third time, ligand exchange is performed, such that the surface contact property of the quantum dot film of the red sub-pixel is converted to be the same as the surface contact property of the quantum dot film of the green sub-pixel, that is, the red quantum dot light-emitting portion and the green quantum dot light-emitting portion are both hydrophobic, and only the electrical response portion of the blue sub-pixel is hydrophilic, as shown in an accompanying drawing at an upper side in FIG. 10.

In an eighth step, a blue quantum dot film with a same surface contact property as the surface contact property of the electrical response portion in the blue sub-pixel is formed, that is, the hydrophilic blue quantum dot light-emitting portion is formed, as shown in an accompanying drawing at a lower side in FIG. 10.

In a ninth step, ligand exchange is performed, the blue quantum dot light-emitting portion of the blue sub-pixel is converted to be a hydrophilic surface, and finally, the quantum dot light-emitting portions of all the sub-pixels are converted to have the same surface contact property, as shown in FIG. 11.

The main difference between this embodiment and the previous embodiment lies in seventh step, that is, in this embodiment, the surface contact property of the blue sub-pixel may be different from the surface contact properties of the other two sub-pixels only through ligand exchange, and the step is simpler.

In an embodiment of the present disclosure, the electrical response portions are formed between the first electrodes and the quantum dot light-emitting portions, the electrical response portions include the conjugated polymers or the reaction products of the conjugated polymers. When forming the patterned quantum dot light-emitting portions, the conjugated polymers in the electrical response portions may be controlled to undergo an oxidation reaction, or the products after the oxidation reaction are controlled to undergo a reduction reaction, such that after different reactions, the electrical response portions may be converted between hydrophilicity and hydrophobicity. The first electrodes of the different sub-pixels are electrified, different surface contact properties of the electrical response portions in the different sub-pixels are achieved, quantum dots of ligands with different surface contact properties are designed respectively, and patterning of the quantum dot light-emitting portions with different light-emitting colors may be achieved.

Although embodiments of the present disclosure have been already described, once those skilled in the art know a basic creative concept, additional changes and modifications may be made to embodiments. Therefore, the appended claims are intended to be illustrated to include embodiments and all changes and modifications falling within the scope of the present disclosure.

Apparently, those skilled in the art may perform various modifications and variations on the present disclosure without departing from the spirit and scope of the present disclosure. Therefore, if these modifications and variations of the present disclosure fall within the scope of the claims of the present disclosure and the equivalent technology thereof, the present disclosure is also intended to include these modifications and variations.

What is claimed is:

1. A quantum dot light-emitting device, comprising a base substrate and a plurality of sub-pixels located on a side of the base substrate and having different light-emitting colors, wherein each of the sub-pixels comprises:

a first electrode;

a quantum dot light-emitting portion, wherein the quantum dot light-emitting portion is located on a side of the first electrode facing away from the base substrate;

an electrical response portion, wherein the electrical response portion is located between the first electrode and the quantum dot light-emitting portion and comprises a conjugated polymer or a reaction product of the conjugated polymer, the electrical response portion is configured to have different surface contact properties by adjusting a voltage of the first electrode when forming the quantum dot light-emitting portion, and the surface contact property is hydrophilic or hydrophobic; and a second electrode, wherein the second electrode is located on a side of the quantum dot light-emitting portion facing away from the electrical response portion.

2. The quantum dot light-emitting device according to claim 1, wherein electrical response portions of parts of the sub-pixels comprise conjugated polymers, and electrical response portions of parts of the sub-pixels comprise oxidation products after the conjugated polymers undergo an oxidation reaction.

3. The quantum dot light-emitting device according to claim 2, wherein the conjugated polymer is one of:

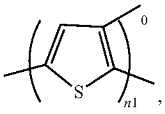
, wherein, n1>1; or

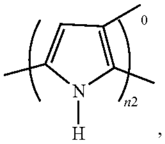
, wherein, n2>1.

4. The quantum dot light-emitting device according to claim 2, wherein the oxidation product is one of:

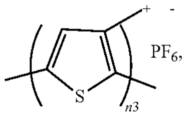

wherein, n3>1;

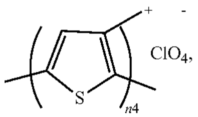

wherein, n4>1;

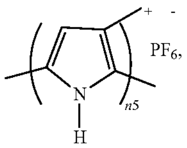

wherein, n5>1; or

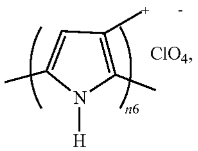

wherein, n6>1.

5. The quantum dot light-emitting device according to claim 1, wherein the electrical response portion is of a porous structure.

6. The quantum dot light-emitting device according to claim 1, wherein quantum dot light-emitting portions of all the sub-pixels have a same surface contact property.

7. The quantum dot light-emitting device according to claim 6, wherein quantum dot ends of the quantum dot light-emitting portions are connected with one of or a combination of:

oxhydryl; or carboxyl.

8. The quantum dot light-emitting device according to claim 6, wherein quantum dot ends of the quantum dot light-emitting portions are connected with one of or a combination of:

alkyl; or aryl.

9. The quantum dot light-emitting device according to claim 1, wherein the quantum dot light-emitting portion is in direct contact with the electrical response portion.

10. The quantum dot light-emitting device according to claim 1, wherein a front film layer is arranged between the first electrode and the electrical response portion.

11. The quantum dot light-emitting device according to claim 10, wherein the front film layer is an electron transport layer; or, the front film layer comprises a hole injection layer and a hole transport layer arranged in a stacked mode, and the hole transport layer is located on a side of the hole injection layer facing away from the first electrode.

12. A display apparatus, comprising the quantum dot light-emitting device according to claim 1.

13. A manufacturing method for a quantum dot light-emitting device, comprising:

forming first electrodes of sub-pixels on a side of a base substrate;

forming electrical response portions comprising conjugated polymers for initial states of the sub-pixels; and sequentially forming quantum dot light-emitting portions of the sub-pixels having different light-emitting colors, wherein a current sub-pixel with a quantum dot light-emitting portion to be formed is taken as a target sub-pixel, and the sequentially forming the quantum dot light-emitting portions of the sub-pixels having the different light-emitting colors comprises: forming the quantum dot light-emitting portion of the target sub-pixel; wherein the forming the quantum dot light-emitting portion of the target sub-pixel comprises:

adjusting surface contact properties of the electrical response portions and/or the quantum dot light-emitting portions, to enable a surface contact property of an exposed surface of the target sub-pixel to be different from surface contact properties of exposed surfaces of the other sub-pixels, wherein the surface contact property is hydrophilic or hydrophobic; and forming a quantum dot light-emitting portion with a same surface contact property as the surface contact property of the exposed surface of the target sub-pixel.

14. The manufacturing method according to claim 13, wherein the target sub-pixel is a first sub-pixel with a quantum dot light-emitting portion to be formed for a first time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels comprises:

loading a first voltage to a first electrode of the first sub-pixel, to enable a conjugated polymer of the first sub-pixel to undergo an oxidation reaction in a state of a solution comprising a reactant.

15. The manufacturing method according to claim 14, wherein the target sub-pixel is a second sub-pixel with a quantum dot light-emitting portion to be formed for a second time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels comprises:

loading a second voltage to a sub-pixel other than the first sub-pixel and the second sub-pixel, to enable a conjugated polymer of the sub-pixel other than the first sub-pixel and the second sub-pixel to undergo an oxidation reaction in a state of a solution comprising a reactant.

16. The manufacturing method according to claim 15, wherein the target sub-pixel is a third sub-pixel with a quantum dot light-emitting portion to be formed for a third time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels comprises:

loading a third voltage to a first electrode of the third sub-pixel, to enable a reaction product of a conjugated polymer of the third sub-pixel to undergo a reduction reaction in a state of a solution comprising a reactant; and performing ligand exchange, to enable a surface contact property of a quantum dot film of the second sub-pixel to be converted to be same as a surface contact property of a quantum dot film of the first sub-pixel.

17. The manufacturing method according to claim 16, wherein, after forming the quantum dot light-emitting portion with the same surface contact property as the surface contact property of the exposed surface of the target sub-pixel, further comprising:

performing ligand exchange, to enable the quantum dot light-emitting portions of all the sub-pixels to be converted to have the same surface contact property.

18. The manufacturing method according to claim 15, wherein the target sub-pixel is a third sub-pixel with a quantum dot light-emitting portion to be formed for a third time, and the adjusting the surface contact properties of the electrical response portions and/or the quantum dot light-emitting portions, to enable the surface contact property of the exposed surface of the target sub-pixel to be different from the surface contact properties of the exposed surfaces of the other sub-pixels comprises:

performing ligand exchange, to enable a surface contact property of a quantum dot film of the first sub-pixel to be converted to be same as a surface contact property of a quantum dot film of the second sub-pixel.

19. The manufacturing method according to claim 18, wherein, after forming the quantum dot light-emitting portion with the same surface contact property as the surface contact property of the exposed surface of the target sub-pixel, further comprising:

performing ligand exchange, to enable the quantum dot light-emitting portions of all the sub-pixels to be converted to have the same surface contact property.

20. The manufacturing method according to claim 13, wherein the forming the electrical response portions comprising the conjugated polymers for the initial states of the sub-pixels comprises:

forming the electrical response portions comprising the conjugated polymers for the initial states of the sub-pixels through electro-deposition.

* * * * *